United States Patent [19]
Yu et al.

[11] Patent Number: 6,113,690
[45] Date of Patent: Sep. 5, 2000

[54] METHOD OF PREPARING CRYSTALLINE ALKALINE EARTH METAL OXIDES ON A SI SUBSTRATE

[75] Inventors: Zhiyi Jimmy Yu; Jerald A. Hallmark, both of Gilbert; Jonathan K. Abrokwah, Tempe; Corey D. Overgaard, Phoenix; Ravi Droopad, Tempe, all of Ariz.

[73] Assignee: Motorola, Inc., Schaumburg, Ill.

[21] Appl. No.: 09/093,081

[22] Filed: Jun. 8, 1998

[51] Int. Cl.$^7$ ................................................ C30B 25/02
[52] U.S. Cl. .......................... 117/84; 117/85; 117/106; 117/107; 117/108; 117/109
[58] Field of Search .................. 117/108, 106, 117/107, 84, 85, 109, 2

[56] References Cited

U.S. PATENT DOCUMENTS

| | | | |
|---|---|---|---|
| 4,661,176 | 4/1987 | Manasevit | 148/175 |
| 4,912,087 | 3/1990 | Aslam et al. | 505/1 |
| 5,173,474 | 12/1992 | Connell et al. | 505/1 |
| 5,225,031 | 7/1993 | McKee et al. | 156/612 |
| 5,358,925 | 10/1994 | Connell et al. | 505/235 |
| 5,418,216 | 5/1995 | Fork | 505/473 |
| 5,482,003 | 1/1996 | McKee et al. | 117/108 |
| 5,588,995 | 12/1996 | Sheldon | 117/201 |
| 5,912,068 | 6/1999 | Jia | 428/210 |

OTHER PUBLICATIONS

Wolf et al., Silicon Processing for the VLSI Era vol. 1: Process Technology, Lattice Press, Sunset Beach, CA,USA, p. 520, 1986.

"Roles of Buffer Layers in Expitaxial Growth of $SrTiO_3$ Films on Silicon Substrates", Bum Ki Moon and Hiroshi Ishiwara, Japanese Journal of Applied Physics, vol. 33 (1994) pp. 1472–1477.

"Epitaxial Growth of $SrTiO_3$ Films on Si(100) Substrates Using a Focused Electron Beam Evaporation Method", Hiroyuki Mori and Hiroshi Ishiwara, Japanese Journal of Applied Physics, vol. 30, No. 8A, Aug. 1991, pp. L 1415–1417.

*Primary Examiner*—Benjamin L. Utech
*Assistant Examiner*—Matthew Anderson
*Attorney, Agent, or Firm*—Eugene A. Parsons; William E. Koch

[57] ABSTRACT

A method of preparing crystalline alkaline earth metal oxides on a Si substrate wherein a Si substrate with amorphous silicon dioxide on a surface is provided. The substrate is heated to a temperature in a range of 700° C. to 800° C. and exposed to a beam of alkaline earth metal(s) in a molecular beam epitaxy chamber at a pressure within approximately a $10^{-9}$–$10^{-10}$ Torr range. During the molecular beam epitaxy the surface is monitored by RHEED technique to determine a conversion of the amorphous silicon dioxide to a crystalline alkaline earth metal oxide. Once the alkaline earth metal oxide is formed, additional layers of material, e.g. additional thickness of an alkaline earth metal oxide, single crystal ferroelectrics or high dielectric constant oxides on silicon for non-volatile and high density memory device applications.

27 Claims, 1 Drawing Sheet

METHOD OF PREPARING CRYSTALLINE ALKALINE EARTH METAL OXIDES ON A SI SUBSTRATE

FIELD OF THE INVENTION

The present invention pertains to methods of preparing crystalline alkaline earth metal oxides on a silicon substrate in preparation for further fabrication processes.

BACKGROUND OF THE INVENTION

An ordered and stable silicon (Si) surface is most desirable for subsequent epitaxial growth of single crystal thin films on silicon for numerous device applications, e.g., ferroelectrics or high dielectric constant oxides for non-volatile and high density memory devices. It is pivotal to establish an ordered transition layer on Si surface, especially for subsequent growth of single crystal oxides, e.g. perovskites. Some reported successful growth of these oxides, such as BaO and $BaTiO_3$ on Si(100) was based on a $BaSi_2$ (cubic) template by depositing one fourth monolayer of Ba on Si(100) using reactive epitaxy at temperatures greater than 850° C. See for example: R. McKee, et al., *Appl. Phys. Lett.* 59(7), pp, 782–784, (Aug. 12, 1991); R. McKee, et al.,*Appl. Phys. Lett.* 63(20), pp, 2818–2820, (Nov. 15, 1993); R. McKee et al., *Mat. Res. Soc. Symp. Proc.*, Vol. 21, pp. 131–135, (1991); U.S. Pat. No. 5,225,01, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". The high temperature requirement for the Molecular Beam Epitaxy surface preparation and template (e.g. $BaSi_2$) formation truly makes the above mentioned process a high temperature process. The major problems are that this high temperature process requires a much higher thermal budget, promotes diffusion in the structure, and often is not desirable or affordable.

It is highly desirable, therefore, to have a Molecular Beam Epitaxy compatible low temperature process that is simple to perform and that provides an ordered wafer surface for subsequent thin film epitaxy.

It is a purpose of the present invention to provide a new and improved method of preparing crystalline alkaline earth metal oxides on a Si substrate.

It is another purpose of the present invention to provide a new and improved method of preparing crystalline alkaline earth metal oxides on a Si substrate using Molecular Beam Epitaxy compatible low temperatures.

It is still another purpose of the present invention to provide a new and improved method of preparing crystalline alkaline earth metal oxides on a Si substrate using a simplified method that requires very little monitoring during the process.

It is a further purpose of the present invention to provide a new and improved method of preparing crystalline alkaline earth metal oxides on a Si substrate which provides an ordered wafer surface.

It is still a further purpose of the present invention to provide a new and improved method of preparing crystalline alkaline earth metal oxides on a Si substrate which does not unnecessarily complicate subsequent process steps.

SUMMARY OF THE INVENTION

The above problems and others are at least partially solved and the above purposes and others are realized in a method of preparing crystalline alkaline earth metal oxides on a Si substrate wherein a Si substrate with silicon dioxide on a surface of the substrate is provided. The substrate is heated to a temperature below the sublimation temperature of the silicon dioxide, and the surface of the substrate is exposed to a beam of alkaline earth metal(s) to convert the amorphous silicon dioxide to a crystalline alkaline earth metal oxide. Additional thickness of an alkaline earth metal oxide, single crystal ferroelectrics or high dielectric constant oxides on silicon for non-volatile and high density memory device applications can then be conveniently formed on the alkaline earth metal oxide, depending upon the application.

BRIEF DESCRIPTION OF THE DRAWINGS

Referring to the drawings.

DESCRIPTION OF THE PREFERRED EMBODIMENT

Figure 1:
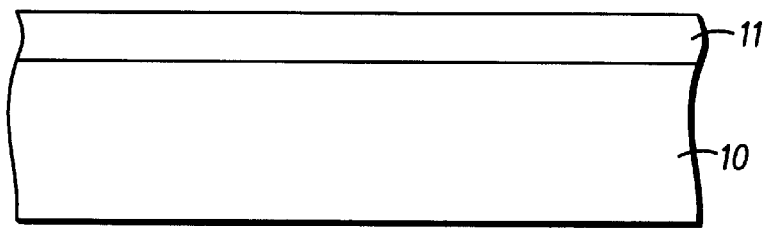
FIG. 1 is a cross-sectional view of a Si substrate with a layer of silicon dioxide on the surface.

Turning now to the drawings in which like characters are designated with like numbers throughout, FIG. 1 illustrates a silicon (Si) substrate 10 with silicon dioxide 11 formed on the surface thereof. Silicon oxide (generally $SiO_2$) naturally exists once silicon substrate 10 is exposed to air (oxygen) or an oxide can be purposely grown in a controlled fashion, as is well known in the art. Extremely good $SiO_2$/Si interfaces can be routinely achieved in the silicon art. However, silicon dioxide layer 11 is amorphous rather than single crystalline and it is desirable for purposes of growing additional single crystal material on the substrate that a single crystal oxide be provided without including layer 11 of amorphous silicon at the oxide/silicon interface.

Epitaxial transition layers are critical for subsequent single crystal oxide growth on Si substrate 10. It has been proven that alkaline earth metals, such as barium, strontium, calcium, etc., are stable on a silicon substrate. $BaSi_2$/BaO transition layers, for example, have been grown on silicon substrates by molecular beam epitaxy (MBE) as described in the articles and patent applications cited above. These transition layers are grown on clean Si substrate surfaces by reactive epitaxy and MBE. However, the sub-monolayer $BaSi_2$ growth requires precise thickness control and the subsequent BaO growth also depends on barium flux and oxygen pressure. The precise thickness and pressure controls complicate the growth process substantially increasing the cost and time of the process.

Si substrate 10 and amorphous silicon dioxide layer 11 are heated to a temperature below the sublimation temperature of oxide layer 11. Generally, silicon dioxide sublimes at a temperature in excess of 850° C., so that substrate 10 is heated, preferably, to a temperature in a range of 700° C. to 800° C. This can be accomplished in a molecular beam epitaxy chamber or substrate 10 can be at least partially heated in a preparation chamber after which substrate 10 can be transferred to the growth chamber and the heating completed.

The pressure in the growth chamber is reduced to approximately the $10^{-9}$–$10^{-10}$ Torr range.

Figure 2:
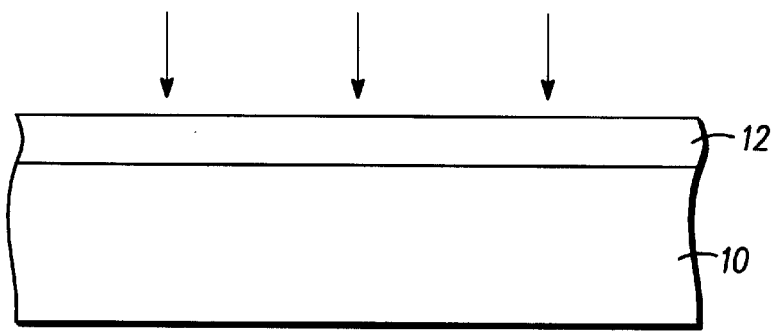
FIG. 2 is a cross-sectional view of the Si substrate of FIG. 1 with the layer of silicon dioxide converted to an alkaline earth metal oxide.

Once substrate 10 is properly heated and the pressure in the growth chamber has been reduced appropriately, the surface of substrate 10 having silicon dioxide layer 11 thereon is exposed to a beam of alkaline earth metal, as illustrated in FIG. 2. In a preferred embodiment, the beam is barium, strontium, or a combination of the two which is generated by resistively heating effusion cells or from e-beam evaporation sources. In a specific example, substrate 10 and oxide layer 11 are exposed to a beam of barium. The barium replaces the silicon in the silicon dioxide and converts layer 11 into a BaO crystalline buffer layer 12. The replaced silicon generally either forms volatile silicon monoxide (SiO) or joins the pure silicon of substrate 10 but the formation of $BaSi_2$ at the Si/BaO interface is not excluded.

The conversion of the silicon dioxide into alkaline earth metal oxide layer 12 is based on the fact that the change of enthalpy (or heat of formation $\Delta H$) for alkaline earth oxides is higher than for silicon dioxide per oxygen atom. See for example Table I below which also lists the lattice constants of the cubic alkaline earth metal oxides.

| Oxide | $SiO_2$ | BaO | SrO | CaO | MgO |
|---|---|---|---|---|---|
| $\Delta H$ (per O) (kJ/mol) | −455.4 | −548.0 | −592.0 | −634.9 | −601.6 |
| $a_o$ (Å) | | 5.542 | 5.160 | 4.799 | 4.208 |

This implies that thermodynamically alkaline earth metal oxides, such as barium oxide, are more stable than $SiO_2$ and the following reactions occur:

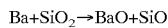

and

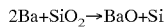

Since cubic single crystalline BaO ($a_o$=5.542 Å) is closely lattice matched to Si ($a_o$=5.432 Å) (1.6% mismatch), an epitaxial layer of BaO will readily form on the surface of Si if the temperature of the Si is maintained high enough (generally in a range of 700° C. to 800° C.) but below the sublimation temperature of $SiO_2$. The lowest reported sublimation temperature for $SiO_2$ is 850° C. A perfect lattice match can be provided by mixing the fluxes of Ba and Sr to produce a layer of (Ba,Sr)O.

Generally, the amorphous silicon dioxide layer 11 on silicon substrate 10 is approximately 50 Å thick to provide an acceptable transition layer 12. It should be understood that thinner or thicker layers can be utilized, in accordance with the specific application. However, if thicker oxide layers are used, the conversion to an alkaline earth metal oxide layer may require more time since the thicker oxide layer must be exposed to the alkaline earth metal molecular beam for a longer period of time. Since the thickness of the amorphous silicon dioxide layer can be easily and very accurately controlled, it ultimately results in a very accurate control of the alkaline earth oxide layer.

As amorphous silicon dioxide layer 11 is exposed to a beam of alkaline earth metal(s), the surface is monitored using Reflection High Energy Electron Diffraction (RHEED) techniques which are well documented in the art and which can be used in situ, i.e. while performing the exposing step within the growth chamber. The RHEED techniques are used to detect or sense surface crystalline structures and in the present process change rapidly from no features for the amorphous silicon dioxide to strong and sharp streaks upon the completion of the conversion process. It will of course be understood that once a specific manufacturing process is provided and followed it may not be necessary to perform the RHEED techniques on every substrate.

Figure 3:
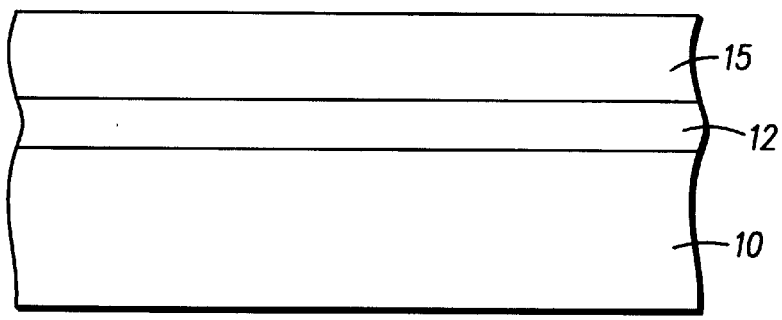
FIG. 3 is a cross-sectional view of the Si substrate of FIG. 2 with additional material formed on the surface of the alkaline earth metal oxide.

Thus, a new and improved method of preparing crystalline alkaline earth metal oxides on a Si substrate is disclosed using Molecular Beam Epitaxy compatible low temperatures and a simplified method that requires very little monitoring during the process. The process is, basically, a self-limiting process which leads to better control over uniformity and thickness. Also, it is a low temperature process compared to the prior art processes. Further, the process provides a crystalline ordered wafer surface that can be utilized to grow additional thickness (illustrated as layer or layers 15 in FIG. 3) of an alkaline earth metal oxide, single crystal ferroelectrics or high dielectric constant oxides on silicon for non-volatile and high density memory device applications, depending upon the application.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of preparing crystalline alkaline earth metal oxides on a Si substrate comprising the steps of:
   providing a Si substrate with silicon dioxide on a surface of the substrate, the silicon dioxide having a sublimation temperature;
   heating the silicon dioxide to a temperature below the sublimation temperature of the silicon dioxide; and
   exposing the silicon dioxide to a beam of alkaline earth metal(s) to create a crystaline alkaline earth metal oxide.

2. A method of preparing crystalline alkaline earth metal oxides on a Si substrate as claimed in claim 1 wherein the alkaline earth metal includes one of barium, strontium, calcium, magnesium and combinations thereof.

3. A method of preparing crystalline alkaline earth metal oxides on a Si substrate as claimed in claim 2 wherein the alkaline earth metal includes barium.

4. A method of preparing crystalline alkaline earth metal oxides on a Si substrate as claimed in claim 2 wherein the alkaline earth metal includes both barium and strontium.

5. A method of preparing crystalline alkaline earth metal oxides on a Si substrate as claimed in claim 1 wherein the step of providing a Si substrate with silicon dioxide on the surface of the substrate includes one of providing a Si substrate with a native oxide on the surface, or providing a Si substrate and forming an oxide on the surface.

6. A method of preparing crystalline alkaline earth metal oxides on a Si substrate as claimed in claim 1 wherein the step of heating the silicon dioxide to a temperature below the sublimation temperature of the silicon dioxide includes heating the silicon dioxide to a temperature in a range of 700° C. to 800° C.

7. A method of preparing crystalline alkaline earth metal oxides on a Si substrate as claimed in claim 1 wherein the step of exposing the silicon dioxide to the beam of alkaline earth metal(s) is performed in a molecular beam epitaxy chamber.

8. A method of preparing crystalline alkaline earth metal oxides on a Si substrate as claimed in claim 7 wherein the step of exposing the silicon dioxide to the beam of alkaline earth metal(s) in the molecular beam epitaxy chamber includes reducing pressure in the chamber to within approximately a $10^{-9}$–$10^{-10}$ Torr range.

9. A method of preparing crystalline alkaline earth metal oxides on a Si substrate as claimed in claim 1 including a step of monitoring the silicon dioxide by RHEED technique during the exposing step to determine a conversion of the silicon dioxide to a crystalline alkaline earth metal oxide.

10. A method of preparing crystalline alkaline earth metal oxides on a Si substrate as claimed in claim 1 including in addition a step of forming additional layers of material on the substrate subsequent to the exposing step.

11. A method of preparing crystalline alkaline earth metal oxides on a Si substrate comprising the steps of:

providing a Si substrate with amorphous silicon dioxide on a surface of the substrate;

heating the amorphous silicon dioxide to a temperature in a range of 700° C. to 800° C.;

exposing the amorphous silicon dioxide to a beam of alkaline earth metal in a molecular beam epitaxy chamber at a pressure within approximately a $10^{-9}$–$10^{-10}$ Torr range; and monitoring the amorphous silicon dioxide by RHEED technique during the exposing step to determine a conversion of the amorphous silicon dioxide to a crystalline alkaline earth metal oxide.

12. A method of preparing crystalline alkaline earth metal oxides on a Si substrate as claimed in claim 11 wherein the alkaline earth metal includes one of barium, strontium, calcium, magnesium and combinations thereof.

13. A method of preparing crystalline alkaline earth metal oxides on a Si substrate as claimed in claim 12 wherein the alkaline earth metal includes barium.

14. A method of preparing crystalline alkaline earth metal oxides on a Si substrate as claimed in claim 12 wherein the alkaline earth metal includes both barium and strontium.

15. A method of preparing crystalline alkaline earth metal oxides on a Si substrate as claimed in claim 11 wherein the step of providing a Si substrate with silicon dioxide on the surface of the substrate includes one of providing a Si substrate with a native oxide on the surface, or providing a Si substrate and forming an oxide on the surface.

16. A method of preparing crystalline alkaline earth metal oxides on a Si substrate as claimed in claim 11 including in addition a step of forming additional layers of material subsequent to the conversion of the amorphous silicon dioxide to the crystalline alkaline earth metal oxide.

17. A method of preparing crystalline alkaline earth metal oxides on a Si substrate comprising the steps of:

providing a Si substrate with amorphous silicon dioxide on a surface of the substrate;

heating the amorphous silicon dioxide to a temperature in a range of 700° C. to 800° C.;

exposing the amorphous silicon dioxide to a beam of one of barium, strontium, and barium-strontium in a molecular beam epitaxy chamber at a pressure within approximately a $10^{-9}$–$10^{-10}$ Torr range;

monitoring the amorphous silicon dioxide by RHEED technique during the exposing step to determine a conversion of the amorphous silicon dioxide to one of a crystalline barium oxide, strontium oxide, and barium-strontium oxide; and forming additional layers of material subsequent to the conversion of the amorphous silicon dioxide to the one of crystalline barium oxide, strontium oxide, and barium-strontium oxide.

18. A method of preparing crystalline alkaline earth metal oxides on a Si substrate as claimed in claim 17 wherein the step of providing a Si substrate with silicon dioxide on the surface of the substrate includes one of providing a Si substrate with a native oxide on the surface, or providing a Si substrate and forming an oxide on the surface.

19. A method of forming a crystalline layer comprising:

providing a crystalline substrate;

forming an amorphous layer on a surface of the crystalline substrate; and exposing the amorphous layer to an additional material which causes the amorphous layer and the additional material to form a substantially defect-free alkaline earth metal oxide crystalline layer.

20. A method of forming a crystalline layer as claimed in claim 19 wherein the lattice constant of the crystalline layer is within 3% of the lattice constant of the crystalline substrate.

21. A method of forming a crystalline layer as claimed in claim 19 wherein the additional material is exposed at a temperature below the sublimation temperature of the amorphous layer.

22. A method of forming a crystalline layer as claimed in claim 21 wherein the additional material is exposed in approximately a $10^{-9}$–$10^{-10}$ Torr range using molecular beam epitaxy.

23. A method of forming a crystalline layer as claimed in claim 19 wherein the substrate is silicon.

24. A method of forming a crystalline layer as claimed in claim 23 wherein the amorphous layer is silicon dioxide.

25. A method of forming a crystalline layer as claimed in claim 24 wherein the silicon dioxide is a native oxide.

26. A method of forming a crystalline layer as claimed in claim 24 wherein the additional material is an alklaline earth metal.

27. A method of forming a crystalline layer as claimed in claim 26 wherein the alkaline earth metal includes at least one of barium, strontium, calcium, and magnesium.

* * * * *